(12) United States Patent
D'Arrigo et al.

(10) Patent No.: US 7,195,946 B2
(45) Date of Patent: Mar. 27, 2007

(54) PROCESS FOR FABRICATING A SEMICONDUCTOR DEVICE HAVING A SUSPENDED MICRO-SYSTEM AND RESULTANT DEVICE

(75) Inventors: Giuseppe D'Arrigo, Sant'Agata Li Battiati (IT); Rosario Corrado Spinella, Catania (IT)

(73) Assignee: STMicroelectronics, S.r.L., Agrate Brianza (IT)

( * ) Notice: Subject to any disclaimer, the term of this patent is extended or adjusted under 35 U.S.C. 154(b) by 31 days.

(21) Appl. No.: 10/884,867
(22) Filed: Jul. 2, 2004

(65) Prior Publication Data

US 2005/0026321 A1 Feb. 3, 2005

(30) Foreign Application Priority Data

Jul. 4, 2003 (EP) .................................. 03425441

(51) Int. Cl.
*H01L 21/00* (2006.01)
(52) U.S. Cl. ............................. 438/54; 438/50; 438/52; 438/53; 438/704; 438/705
(58) Field of Classification Search .................. 438/50, 438/52–54, 704–705
See application file for complete search history.

(56) References Cited

U.S. PATENT DOCUMENTS 6,021,675 A 2/2000 Seefeldt et al.

(Continued)

FOREIGN PATENT DOCUMENTS

EP 0 451 992 10/1991

(Continued)

OTHER PUBLICATIONS

Quanbo Zu et al., "Design and Fabrication of Silicon Condenser Microphone Using Corrugated Diaphragm Technique", Journal of Microelectromechanical Systems, vol. 5, No. 3, Sep. 1996, pp. 197-203, XP000636781.

(Continued)

*Primary Examiner*—Zandra V. Smith
*Assistant Examiner*—Bac H. Au
(74) *Attorney, Agent, or Firm*—Lisa K. Jorgenson; Stephen Bongini; Fleit, Kain, Gibbons, Gutman, Bongini & Bianco P.L.

(57) ABSTRACT

A method is provided for fabricating a semiconductor device that includes a suspended micro-system. According to the method, a silicon porous layer is formed above a silicon substrate, and the silicon porous layer is oxidized. An oxide layer is deposited, and a first polysilicon layer is deposited above the oxide layer. The first polysilicon layer, the oxide layer, and the silicon porous layer are selectively removed. A nitride layer is deposited, and a second polysilicon layer is deposited. The second polysilicon layer, the nitride layer, the first polysilicon layer, and the oxide layer are selectively removed. The silicon porous layer is removed in areas made accessible by the previous step. Also provided is a semiconductor device that includes a suspended structure fixed to at least two walls through a plurality of hinges, with the suspended structure including an oxide layer, a first polysilicon layer, a nitride layer, and a second polysilicon layer.

18 Claims, 3 Drawing Sheets

U.S. PATENT DOCUMENTS

| | | | |
|---|---|---|---|
| 6,734,762 B2* | 5/2004 | Cornett et al. | 333/186 |
| 2001/0026951 A1* | 10/2001 | Vergani et al. | 438/52 |
| 2002/0189350 A1 | 12/2002 | Tu | |
| 2006/0037932 A1* | 2/2006 | Lammel et al. | 216/2 |

FOREIGN PATENT DOCUMENTS

| EP | 0 747 686 | 12/1996 |
|---|---|---|

OTHER PUBLICATIONS

M.-A. Gretillat et al., "Electrostatic Polysilicon Microrelays Integrated with MOSFETs", Micro Electro Mechanical Systems, 1994, MEMS '94, Proceedings, IEEE Workshop on Oiso, Japan, Jan. 25-28, 1994, New York, NY, USA, IEEE, pp. 97-101, XP010207751.

L.-A. Liew et al., "Modeling of Thermal Actuation in a Bulk-Micromachined CMOS Micromirror", Microelectronics Journal, Mackintosh Publications Ltd., vol. 31, No. 9-10, Oct. 2000, pp. 791-801, XP004218842.

European Search Report dated Nov. 25, 2003 for European Application No. 03425441.7.

* cited by examiner

PROCESS FOR FABRICATING A SEMICONDUCTOR DEVICE HAVING A SUSPENDED MICRO-SYSTEM AND RESULTANT DEVICE

CROSS-REFERENCE TO RELATED APPLICATIONS

This application is based upon and claims priority from prior European Patent Application No. 03 425 441.7, filed Jul. 4, 2003, the entire disclosure of which is herein incorporated by reference.

BACKGROUND OF THE INVENTION

1. Field of the Invention

The present invention relates to semiconductor devices, and more particularly to a process for fabricating a semiconductor device having a suspended micro-system, the resultant semiconductor device, and its applications.

2. Description of Related Art

Suspended micro-systems, which are also known as semiconductor suspended structures, in integrated circuits are generally used in the case in which there is the necessity to provide orthogonal movements of portions of the surface of a crystal of silicon opportunely worked. The use of such micro-systems can be, for example, for the realization of a thermally moved micro-mirror.

The obtainment of such structures is a very complex process. The complexity is to be found in the impossibility of realizing sacrificial layers of elevated thickness, for example of about ten microns, with the VLSI and ULSI technologies.

Traditionally this drawback is resolved through the use of processes that require the bulk working (i.e., from the back) of the silicon structure through anisotropic erosion activated by basic solutions such as KOH or TMAH, or through techniques of wafer bonding or smart cutting, or by using silicon wafer on insulator technology.

SUMMARY OF THE INVENTION

In view of these drawbacks, it is an object of the present invention to overcome these drawbacks and to provide a simple to realize process for fabricating a semiconductor device that includes a suspended micro-system.

According to one embodiment of the present invention, there is provided a method for fabricating a semiconductor device that includes a suspended micro-system. According to the method, a silicon porous layer is formed above a silicon substrate, and the silicon porous layer is oxidized. An oxide layer is deposited, and a first polysilicon layer is deposited above the oxide layer. The first polysilicon layer, the oxide layer, and the silicon porous layer are selectively removed. A nitride layer is deposited, and a second polysilicon layer is deposited. The second polysilicon layer, the nitride layer, the first polysilicon layer, and the oxide layer are selectively removed. The silicon porous layer is removed in areas made accessible by the previous step.

According to another embodiment of the present invention, there is provided a semiconductor device that includes a silicon substrate, at least two walls located above the silicon substrate, and a suspended structure fixed to the two walls through hinges. The two walls include a first nitride layer and a second polysilicon layer, and the suspended structure includes an oxide layer, a first polysilicon layer, the nitride layer, and the second polysilicon layer.

According to a further embodiment of the present invention, there is provided a micro-mirror that is adapted to be fixed to at least two walls of a semiconductor device through a plurality of hinges. The micro-mirror is composed of a succession of layers that includes an oxide layer, a first polysilicon layer, a nitride layer, and a second polysilicon layer.

The present invention makes it possible to realize a suspended micro-system using a porous layer of silicon as sacrificial oxide and to create in such a way a three-dimensional structure below the suspended micro-system that allows the micro-system to move freely without touching structures near it. Preferably, the micro-system is suspended by hinges formed of the same material as the micro-system, but that has not been removed. The hinges are connected to walls that are formed during the fabrication of the device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
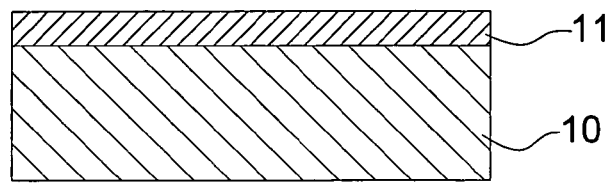
FIGS. 1–9 show the phases of a process for fabricating a semiconductor device having a suspended micro-system according to a preferred embodiment of the present invention.
Figure 2:
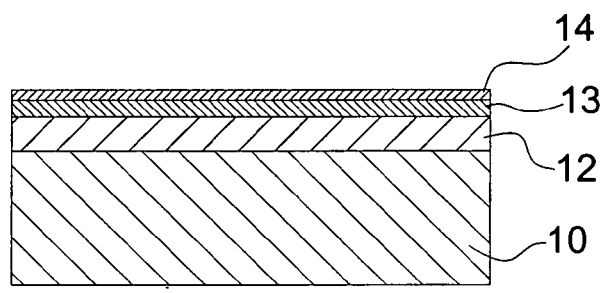

Preferred embodiments of the present invention will be described in detail hereinbelow with reference to the attached drawings.

With reference to FIGS. 1–9, there will now be described the phases of a process for fabricating a semiconductor device having a suspended micro-system according to a preferred embodiment of the present invention.

The substrate 10 is constituted by a wafer Cz (100) of p+ type, preferably with concentrations greater than $5*10^{17}$ B/cm$^3$. As an alternative, substrates of p− type can be used with an epitaxy p+ on the surface with a height that is at least equal to the porous structure 11 to be formed with a further enrichment on the back, with the purpose of getting a good ohmic contact for the formation of the porous layer 11 during the electrochemical process.

The first step of the process is the formation of a porous layer 11 with a desired height and porosity that can easily be fixed according to the time and the etching conditions (e.g., density of current, chemical parameters of the solution, and doping concentration).

Curves that allow valuing the variation of etch rate are available, as silicon thickness transformed by minute and the porosity variation in percentage, on the varying of the current density that flows in the cell of the electrochemical process. For example, for the realization of a porous silicon layer 11 with a thickness of 10 microns and a 70% porosity, 10 minutes are necessary and a current of between 20 and 40 mA/cm$^2$. Through these processes it is possible to get a porous oxide layer of elevated thickness on the order of about some tens of microns.

The following step provides for the oxidation of the porous layer 11, to produce an oxidized porous layer 12. The oxidation is performed at low temperature, preferably around 900° C. for a brief period of 30 minutes, enough for oxidizing the thread-like structure with an average diameter of 50 nm (that can vary in accordance with the process) which constitutes the crystalline skeleton of the porous silicon. Through these processes it is possible to get a porous oxide layer of elevated thickness on the order of about ten microns.

After the oxidation process it is possible to close the superficial pores with a thin oxide layer PSG (Phosphorous Silicon Glass) 13, deposed through CVD (Chemical Vapor Deposition). There is then deposited a polysilicon layer 14, preferably with dimensions between 200 and 400 nm, that will be used as an etching mask for the porous oxide 12, given the elevated thickness of the oxidized structure.

If at this point it is necessary to suspend some structures in polysilicon, the porosity in the structure would create notable difficulties since in the processes of wet removal the sacrificial porous oxide, because of the dense net of capillary, would uniformly and totally be corroded under the polysilicon structure, so as to cause the separation not only of some structures to be suspended but also of the anchorages.

The following steps allow there to be realized some suspended structures in polysilicon by using the oxidized porous layer as a sacrificial layer.

Figure 3:
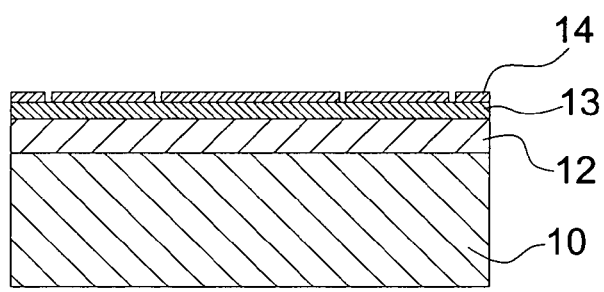

A process of deposition and photoengraving of the resist follows. Then a plasma etching of the polysilicon layer 14, preferably effected with a mixture of $Cl_2$ and HBr followed by a process with high selectivity with respect to the silicon oxide with a mixture of He, $O_2$, and HBr, is carried out, so as to delimit portions of the structure, as shown in FIG. 3.

Figure 4:
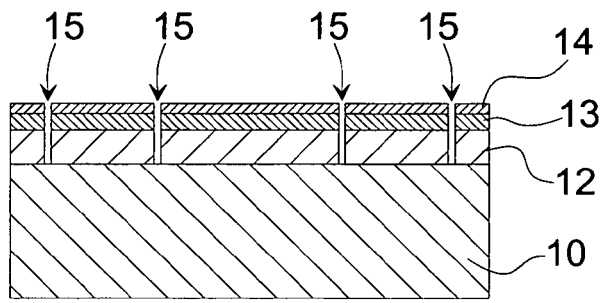

The structure so obtained is used as a dry etching mask, preferably with a mixture of $CF_4$, $CHF_3$, and Ar, for the oxide layer PSG 13 and the porous oxide layer 12, up to the substrate 10. Trenches 15 are therefore created, as shown in FIG. 4.

Figure 5:
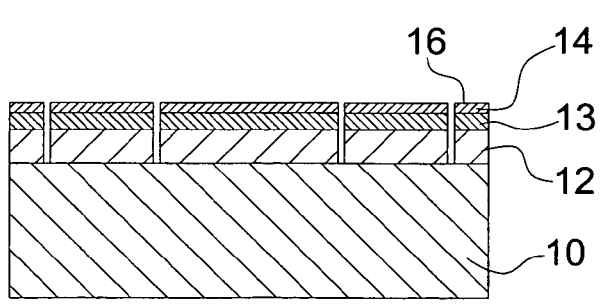
Figure 6:
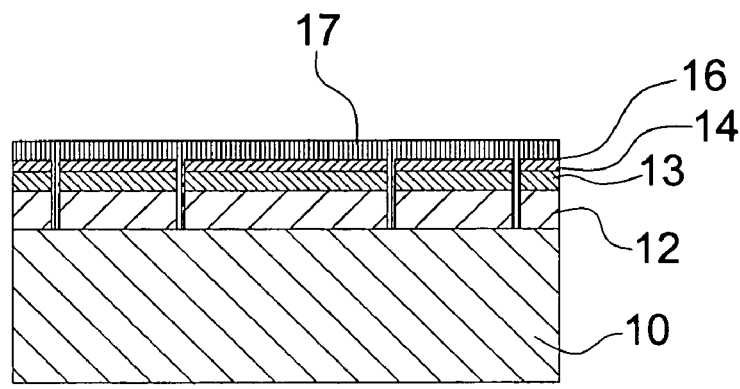

At this point the deposition of a nitride layer ($Si_3N_4$) 16 is executed through LPCVD (Low Pressure Chemical Vapor Deposition) on the whole device, preferably to a thickness of around 140 nm, so as to form a similar superficial layer that is also in the trenches 15, as shown in FIG. 5.

Then a polysilicon layer 17 is deposed, preferably through CVD using a mixture of $SiH_4$ and $AsH_3$ at a temperature of 660° C., so as to fill the trenches 15 and a superficial thickness at least equal to half the width of the trenches 15. The two layers 16 and 17 will uniformly distribute themselves on the whole surface so as to link to the silicon substrate.

Through this sequence of plasma depositions and etches it is possible to realize some three-dimensional structures of porous oxide 12, hooked to the substrate 10 and laterally and upwardly sealed by the nitride layer 16 and by the following layers.

Figure 7:
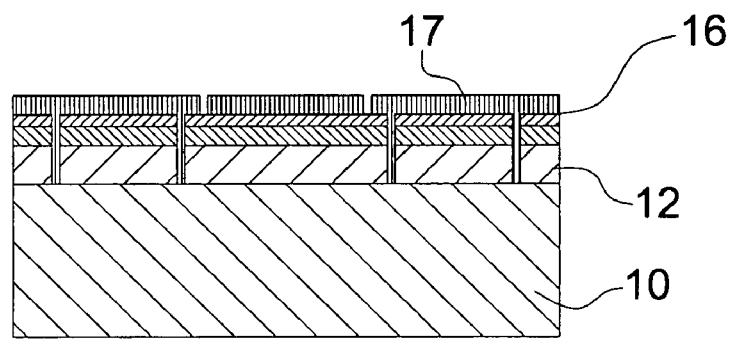

The process continues with the lithography of the polysilicon layer 17 that will be used as mask for the following etching, as shown in FIG. 7. There is then the plasma etching of the triple layer, effected in two phases by using the same procedure as for the erosion of the poly-Si 14, that is a plasma etching, preferably effected with a mixture of $Cl_2$ and HBr followed by a process with high selectivity with respect to the silicon oxide with a mixture of He, $O_2$, and HBr.

Figure 8:
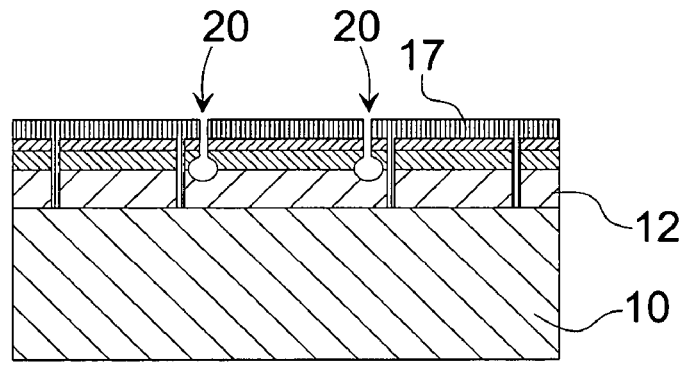

The nitride layers 16 and the oxide layer PSG 13 are removed with a plasma etching, preferably using a mixture of $CF_4$ and $CH_3Ar$, as shown in FIG. 8. In this way, zones 20 are created that go beyond the above-mentioned three layers and allow the following etching for the removal of the porous oxide 12.

The following wet etching, preferably with a solution containing HF, such as a water solution with a concentration of HF at 10% for a time of 1000 seconds, allows the selective removal of the porous oxide 12, so as to leave the oxide 13 untouched inside a three-dimensional structure 18, and therefore there is obtained the suspended structure 19. Thus, such a suspended structure 19 is obtained by sacrificing (eliminating) the porous oxide 11, and creating an empty space, that is the three-dimensional structure 18, below the suspended structure 19.

Figure 9:
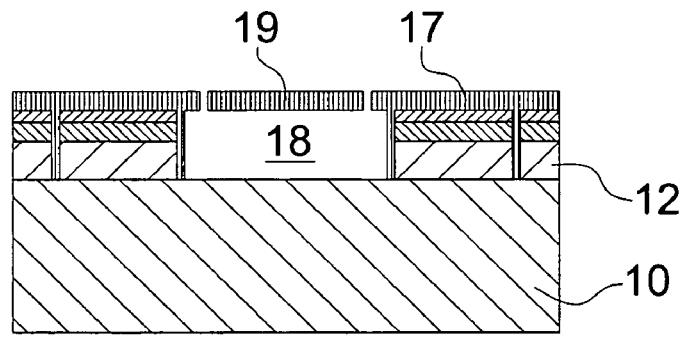

From FIG. 9 it seems that the suspended structure 19 is not bound to the device because it shows only a section. In reality the mask used for the etching, constituted by the polysilicon layer 17, is to be created so as to obtain a suspended structure 19 bound to the device through opportune hinges (as shown in FIG. 10) that are obtained through limited portions of structure that are not removed, according to the specific form desired for the suspended structure 19.

Figure 10:
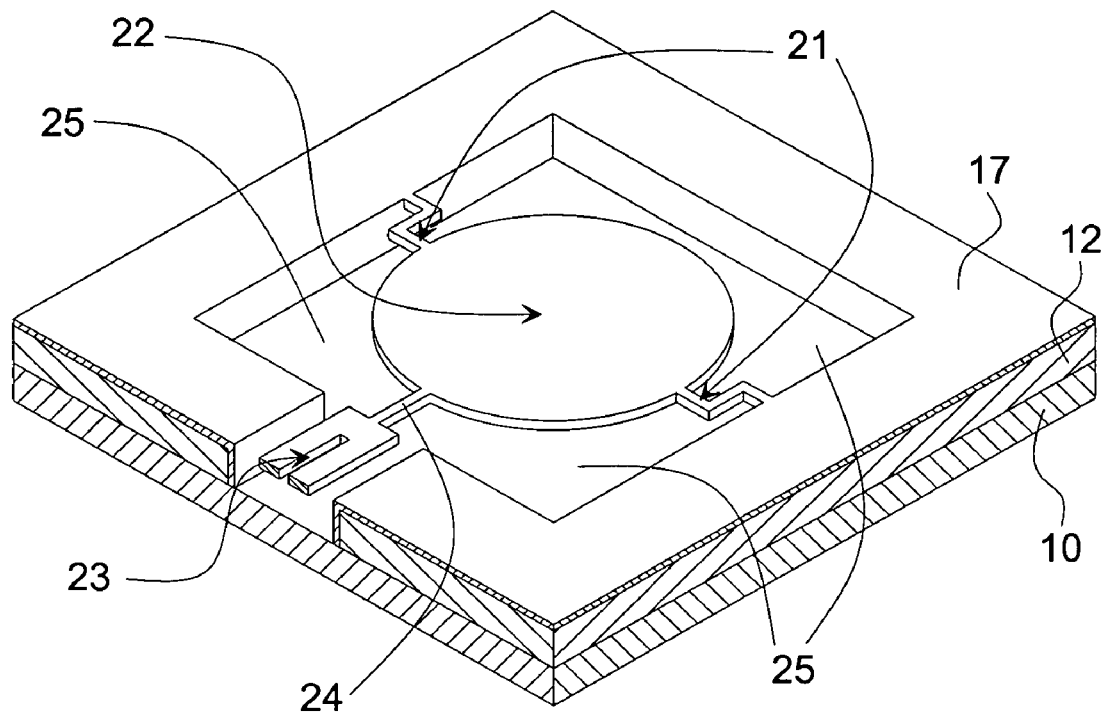
FIG. 10 shows a partial three-dimensional view of the structure of a micro-mirror that is obtained through a fabrication process according to an embodiment of the present invention.

FIG. 10 shows an exemplary application of the present invention. In fact, it shows the structure of a device obtained through the process described above, with the suspended structure 22 here representing a micro-mirror having hinges 21 that allow the suspension and the rotation of this suspended structure 22. The moving of the micro-mirror 22 is effected by a thermo-actuator 23 that, for example, exploits the thermo-mechanic effect of bimetallic foils that is obtained by the different thermal expansion of the materials depending on the variation of the temperature following the passage of current (in this exemplary case the materials are the layer of poly-Si and the underlying nitride layer, connected to the micro-mirror 22 through the hinge 24).

In this exemplary application, the lithographic process of the polysilicon layer 17, which will constitute the etching mask of the nitride layer 16, the polysilicon layer 14, and the oxide layer PSG 13, has been effected so as to define three areas 25 to free and so as to leave the opportunely shaped hinges 21 and 24 that hook the micro-mirror 22 to the device. In the following etching phase the porous layer 12 is removed in the areas 25 and under the micro-mirror 22.

The fabrication process of the present invention can be embedded in hardware, software, or a combination of hardware and software. Any processor, controller, or other apparatus adapted for carrying out the functionality described herein is suitable. For example, a machine-readable medium can be encoded with a program containing instructions for performing the steps of the method described above. A typical combination of hardware and software could include a general purpose microprocessor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for fabricating a semiconductor device that includes a suspended micro-system, said method comprising the steps of:
    providing a silicon substrate;
    forming a silicon porous layer above the silicon substrate;
    oxidizing the silicon porous layer to produce an oxidized porous layer;
    depositing an oxide layer on the whole device;
    depositing a first polysilicon layer above the oxide layer;
    selectively removing the first polysilicon layer, the oxide layer, and the oxidized porous layer up to the silicon substrate so as to create at least one trench that reaches the silicon substrate;
    depositing a nitride layer on the whole device;
    depositing a second polysilicon layer on the whole device;
    selectively removing the second polysilicon layer so as to define areas to free and so as to leave a plurality of hinges that connect a suspended structure to the device;
    using the second polysilicon layer as a mask to etch the nitride layer, the first polysilicon layer, and the oxide layer; and
    removing the oxidized porous layer in areas made accessible by the previous steps of selectively removing and using, so as to create an empty space below the suspended structure, the hinges suspending the suspended structure over the empty space and allowing rotation of the suspended structure.

2. The method according to claim 1, wherein in the step of selectively removing the first polysilicon layer, the oxide layer, and the oxidized porous layer:
    the first polysilicon layer, the oxide layer, and the oxidized porous layer are selectively removed by using the first polysilicon layer as mask for a photo-lithographic process.

3. The method according to claim 1, wherein in the step of removing the oxidized porous layer, the oxidized porous layer is removed in the free areas and under the suspended device.

4. The method according to claim 1, wherein in the step of removing the oxidized porous layer, a portion of the oxidized porous layer surrounded by the trench is removed, so as to leave a portion of the oxidized porous layer that is outside of the trench.

5. The method according to claim 1, further comprising the step of forming an actuator that is connected to one of the hinges.

6. The method according to claim 5, wherein the actuator is a thermo-actuator.

7. A method for fabricating a semiconductor device that includes a suspended micro-system, said method comprising the steps of:
    forming a silicon porous layer above a substrate;
    oxidizing the silicon porous layer to produce an oxidized porous layer;
    depositing an oxide layer above the oxidized porous layer;
    depositing a first polysilicon layer above the oxide layer;
    selectively removing the first polysilicon layer, the oxide layer, and the oxidized porous layer up to the silicon substrate so as to create at least one trench that reaches the silicon substrate; and
    using a portion of the oxidized porous layer that is within the trench as sacrificial oxide so as to create an empty space below the suspended micro-system.

8. The method according to claim 7, wherein the suspended micro-system is bound to the device through a plurality of hinges that are formed by limited portions that are not removed, the hinges allowing suspension and rotation of the suspended micro-system and being formed by the same layers as the suspended micro-system.

9. A machine-readable medium encoded with a program for fabricating a semiconductor device that includes a suspended micro-system, the program containing instructions for performing the steps of:
    forming a silicon porous layer above a substrate;
    oxidizing the silicon porous layer to produce an oxidized porous layer;
    depositing an oxide layer above the oxidized porous layer;
    depositing a first polysilicon layer above the oxide layer;
    selectively removing the first polysilicon layer, the oxide layer, and the oxidized porous layer up to the silicon substrate so as to create at least one trench that reaches the silicon substrate; and
    using a portion of the oxidized porous layer that is within the trench as sacrificial oxide so as to create an empty space below the suspended micro-system.

10. The machine-readable medium according to claim 9, wherein the suspended micro-system is bound to the device through a plurality of hinges that are formed by limited portions that are not removed, the binges allowing suspension and rotation of the suspended micro-system and being formed by the same layers as the suspended micro-system.

11. The machine-readable medium according to claim 9, wherein the using step comprises:
    depositing a nitride layer on the whole device;
    depositing a second polysilicon layer over the nitride layer;
    selectively removing the second polysilicon layer so as to define areas to flee and so as to leave a plurality of hinges that connect the suspended micro-system to the device;
    using the second polysilicon layer as a mask to etch the nitride layer, the first polysilicon layer, and the oxide layer; and
    removing the oxidized porous layer in areas made accessible by the previous steps of selectively removing and using, so as to create the empty space below the suspended micro-system, the hinges suspending the suspended micro-system over the empty space and allowing rotation of the suspended structure.

12. The machine-readable medium according to claim 9, wherein in the step of selectively removing the first polysilicon layer, the oxide layer, and the oxidized porous layer:
    the first polysilicon layer, the oxide layer, and the oxidized porous layer are selectively removed by using the first polysilicon layer as mask for a photo-lithographic process.

13. A machine-readable medium encoded with a program for fabricating a semiconductor device that includes a suspended micro-system, the program containing instructions for performing the steps of:
    providing a silicon substrate;
    forming a silicon porous layer above the silicon substrate;
    oxidizing the silicon porous layer to produce an oxidized porous layer;

depositing an oxide layer on the whole device;

depositing a first polysilicon layer above the oxide layer;

selectively removing the first polysilicon layer, the oxide layer, and the oxidized porous layer up to the silicon substrate so as to create at least one trench that reaches the silicon substrate;

depositing a nitride layer on the whole device;

depositing a second polysilicon layer on the whole device;

selectively removing the second polysilicon layer so as to define areas to free and so as to leave a plurality of hinges that connect a suspended structure to the device;

using the second polysilicon layer as a mask to etch the nitride layer, the first polysilicon layer, and the oxide layer; and removing the oxidized porous layer in areas made accessible by the previous steps of selectively removing and using, so as to create an empty space below the suspended structure, the hinges suspending the suspended structure over the empty space and allowing rotation of the suspended structure.

14. The machine-readable medium according to claim 13, wherein the in the step of selectively removing the first polysilicon layer, the oxide layer, and the oxidized porous layer:

the first polysilicon layer, the oxide layer, and the oxidized porous layer are selectively removed by using the first polysilicon layer as mask for a photo-lithographic process.

15. The machine-readable medium according to claim 13, wherein in the step of removing the oxidized porous layer, the oxidized porous layer is removed in the free areas and under the suspended device.

16. The machine-readable medium according to claim 13, wherein in the step of removing the oxidized porous layer, a portion of the oxidized porous layer surrounded by the trench is removed, so as to leave a portion of the oxidized porous layer that is outside of the trench.

17. The machine-readable medium according to claim 13, wherein the program further contains instructions for performing the step of forming an actuator that is connected to one of the hinges.

18. The machine-readable medium according to claim 17, wherein the actuator is a thermo-actuator.

* * * * *